US006211719B1

(12) United States Patent
deBrigard

(10) Patent No.: US 6,211,719 B1
(45) Date of Patent: Apr. 3, 2001

(54) POWER CONTROL CIRCUIT FOR A LINE DRIVER

(75) Inventor: Thomas H. deBrigard, Point Pleasant, NJ (US)

(73) Assignee: Globespan Semiconductor Inc., Red Bank, NJ (US)

( * ) Notice: Subject to any disclaimer, the term of this patent is extended or adjusted under 35 U.S.C. 154(b) by 0 days.

(21) Appl. No.: 09/294,131

(22) Filed: Apr. 19, 1999

(51) Int. Cl.[7] .................................................. H03K 17/16

(52) U.S. Cl. .......................................... 327/379; 326/30

(58) Field of Search ..................................... 327/333, 514, 327/594, 517, 583, 584, 585, 427, 431, 434, 379; 326/30

(56) References Cited

U.S. PATENT DOCUMENTS

| | | | |
|---|---|---|---|
| 5,153,875 | 10/1992 | Takatori | 370/32.1 |
| 5,519,340 | 5/1996 | Rybicki et al. | 326/88 |
| 5,687,049 | * 11/1997 | Mangtani | 361/18 |
| 5,714,862 | * 2/1998 | Mikesell et al. | 318/807 |
| 5,825,819 | 10/1998 | Cogburn | 375/257 |
| 5,856,758 | 1/1999 | Joffe et al. | 330/85 |
| 5,872,811 | 2/1999 | Gusinov | 375/257 |
| 6,019,949 | * 2/2000 | Dunder | 422/186.07 |
| 6,035,235 | * 3/2000 | Perttu et al. | 607/5 |

OTHER PUBLICATIONS

NEC, Data sheet for PS2701–1, 2, and 4, High Isolation Voltage SOP Multi Optocoupler, 4 pages.

Temic Semiconductors, Data sheet for Si 9958DY, Dual Enhancement–Mode MOSFET (N–and P–Channel), Apr. 15, 1996, pp. 163–168.

* cited by examiner

Primary Examiner—My-Trang Nu Ton
(74) Attorney, Agent, or Firm—Thomas, Kayden, Horstemeyer & Risley

(57) ABSTRACT

The present invention is generally directed to a power control circuit for a line driver circuit in a central office. In a broad sense, the present invention operates to power-down line driver circuitry when it is not in use, and apply power to the line driver circuitry when transmissions are requested by a customer (e.g., customer premises). This reduces the power consumption of the line driver by eliminating the quiescent current draw when the line driver is idle. Recognizing that the typical line driver is in an idle state the vast majority of the time, compounded by the vast number of line drivers that exist within a central office environment, it will be appreciated that the overall power savings may be tremendous. In accordance with one aspect of the invention a circuit is provided for controllably applying power to a line driver. The circuit includes an isolation circuit disposed to receive a power control signal, the isolation circuit configured to generate a pair of output signals that are electrically isolated from the power control signal, each of the output signals having a state that is determined by the power control signal. The circuit also includes a power application circuit having a first and second input and a first and second output, wherein the first input is coupled to a first output of the isolation circuit and the second input is coupled to a second output of the isolation circuit, and wherein the first output is disposed to be coupled to a positive power input of the line driver and the second is disposed to be coupled to a negative power input of the line driver. A related method is also provided.

23 Claims, 5 Drawing Sheets

POWER CONTROL CIRCUIT FOR A LINE DRIVER

BACKGROUND OF INVENTION

1. Field of the Invention

The present invention generally relates to telecommunications circuitry, and more particularly to a circuit that controls the application of power to a line driver circuit.

2. Discussion of the Related Art

In recent years telephone communication systems have expanded from traditional plain old telephone system (POTS) communications to include high-speed data communications as well. As is known, POTS communications includes not only the transmission of voice information, but also PSTN (public switched telephone network) modem information, control signals, and other information that is transmitted in the POTS bandwidth, which extends from approximately DC to approximately 3.4 kilohertz.

New, high-speed data communications provided over digital subscriber lines, such as Asymmetric Digital Subscriber Line (ADSL), Rate Adaptive Digital Subscriber Line (RADSL), etc. (more broadly denoted as XDSL) provide for high speed data transmissions, as is commonly used in communicating over the Internet. As is known, the bandwidth for XDSL transmissions is generally defined by a lower cutoff frequency of approximately 30 kilohertz, and a higher cutoff frequency which varies depending upon the particular technology. Since the POTS and XDSL signals are defined by isolated frequency bands, both signals may be transmitted over the same two-wire loop.

A "line-card," containing line interface circuitry, is provided at the central office. The line interface circuitry provides the interconnections among xDSL circuitry, POTS or PSTN voice circuitry, off-hook (or tip/ring) detection circuitry, ring generator circuitry, and the local loop. The line interface circuitry also includes appropriate electronic filtering circuitry that operates to minimize any noise transmission across the local loop. As is known, the line interface circuitry includes a POTS filter that is interposed between the various POTS circuits and the xDSL circuit. This filter protects the POTS circuitry from the high frequency signals of the XDSL transmission circuitry. It also serves to minimize noise transmissions across the local loop from the central office to the customer premises.

As is known, a central office typically includes numerous line cards to service a number of local loops. Each line card includes a line driver circuit that drives signals across the local loop. It should be appreciated that, for any given local loop, the line driver spends a significant percentage of time in standby operation (ie., not transmitting). During this "standby" time, however, the line driver circuit continues to consume power. Although the power consumed by a single line driver circuit is relatively small (often on the order of approximately 30 mAmps), this power consumption, multiplied by the large number of line drivers in a central office location, realizes a relatively large overall power consumption.

Accordingly, there is a desire to provide line driver circuitry that dissipates less power than line driver circuitry known in the prior art.

SUMMARY OF INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve certain advantages and novel features, the present invention is generally directed to a power control circuit for a line driver circuit in a central office. In a broad sense, the present invention operates to power-down line driver circuitry when it is not in use, and apply power to the line driver circuitry when transmissions are requested by a customer (e.g., customer premises). This reduces the power consumption of the line driver by eliminating the quiescent current draw when the line driver is idle. Recognizing that the typical line driver is in an idle state the vast majority of the time, compounded by the vast number of line drivers that exist within a central office environment, it will be appreciated that the overall power savings may be tremendous.

In accordance with one aspect of the invention a circuit is provided for controllably applying power to a line driver. The circuit includes an isolation circuit disposed to receive a power control signal, the isolation circuit configured to generate a pair of output signals that are electrically isolated from the power control signal, each of the output signals having a state that is determined by the power control signal. The circuit also includes a power application circuit having a first and second input and a first and second output, wherein the first input is coupled to a first output of the isolation circuit and the second input is coupled to a second output of the isolation circuit, and wherein the first output is disposed to be coupled to a positive power input of the line driver and the second is disposed to be coupled to a negative power input of the line driver.

In accordance with the preferred embodiment, circuit includes a first optocoupler comprising a first light emitting diode and a first phototransistor disposed to sense emissions from the first light emitting diode, wherein the first light emitting diode is configured to receive an input power control signal. The circuit also includes a second optocoupler comprising a second light emitting diode and a second phototransistor disposed to sense emissions from the second light emitting diode, wherein the second light emitting diode is series-connected with the first light emitting diode between the input power control signal and ground. The circuit also includes a p-channel MOSFET having a source node coupled to a positive power supply, the p-channel MOSFET having a gate node coupled to an output of the first phototransistor, and the p-channel MOSFET having a drain output coupled to a positive power input of the line driver. The circuit includes a n-channel MOSFET having a source node coupled to a negative power supply, the n-channel MOSFET having a gate node coupled to an output of the second phototransistor, and the n-channel MOSFET having a drain output coupled to a negative power input of the line driver. The circuit further includes a first voltage control circuit coupled to the gate node of the p-channel MOSFET, the first voltage control circuit configured to turn the p-channel MOSFET off when the first optocoupler is turned on, the first voltage control circuit configured to turn the p-channel MOSFET on when the first optocoupler is turned off. Finally, the circuit includes a second voltage control circuit coupled to the gate node of the n-channel MOSFET, the second voltage control circuit configured to turn the n-channel MOSFET off when the second optocoupler is turned on, the second voltage control circuit configured to turn the n-channel MOSFET on when the second optocoupler is turned off.

In accordance with another aspect of the invention, a system is provided for controllably applying power to a line driver. The system includes a line driver circuit at a central office having a first and second output signal configured to transmit a differential transmission signal to a customer premises over a local loop. The system also includes an impedance matching circuit disposed at an output of the line driver circuit and configured to maintain a low impedance of conductors within the local loop. The system further includes a start-up control circuit coupled to the local loop and configured to sense signal activity over the local loop. Finally, the system includes a power application control circuit coupled to the line driver circuit and configured to control the application of power signals to the line driver circuit, in response to the start-up control circuit.

In accordance with another aspect of the invention, a method is provided for controlling the application of power to a line driver. The method includes the steps of sensing a request from a customer premises for a transmission exchange across a local loop and applying power to a line driver circuit, in response to the request for transmission. In addition, the method includes the steps of determining when the transmission exchange has terminated, and terminating the application of power to the line driver circuit.

BRIEF DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
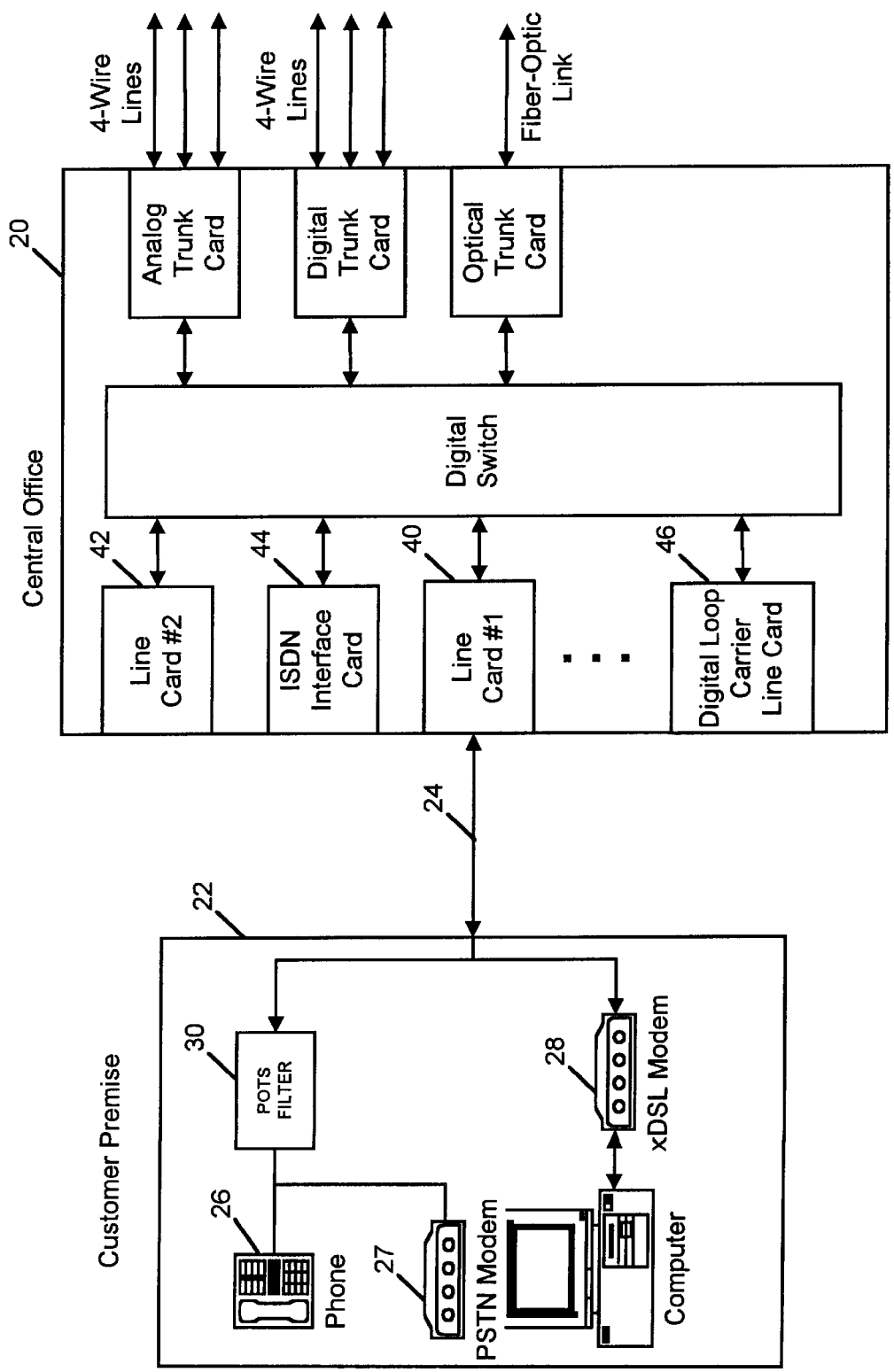
FIG. 1 is a block diagram of a system shown a central office and customer premises inter-communication link, across a twisted pair.

Having summarized the invention above, reference will now be made in detail to the description of the invention as illustrated in the drawings. While the invention will be described in connection with these drawings, there is no intent to limit the invention to the embodiment or embodiments disclosed therein. On the contrary, the intent is to cover all alternatives, modifications and equivalents included within the spirit and scope of the invention as defined by the appended claims.

Turning now to the drawings, reference is made to FIG. 1, which is a block diagram illustrating communication between a central office 20 and a customer premises 22 by way of local loop 24, as is known in the prior art. While the customer premises 22 may be a single dwelling residence, a small business, or other entity, it is generally characterized as having POTS equipment, such as a telephone 26, PSTN modem 27, fax machine (not shown), etc. The customer premise 22 may also include a xDSL communication device, such as a xDSL modem 28. When an xDSL service is provided, a POTS filter 30 is interposed between the POTS equipment 26 and the local loop 24. As is known, the POTS filter 30 includes a low-pass filter having a cut-off frequency of approximately 4 kilohertz to 10 kilohertz, in order to filter high frequency transmissions from the xDSL communication device 28 and protect the POTS equipment.

At the central office 20, additional circuitry is provided. Generally, a line card 40 containing line interface circuitry is provided for electrical connection to the local loop 24. In fact, multiple line cards 40, 42 are typically provided to serve a plurality of local loops. In the same way, additional circuit cards are typically provided at the central office 20 to handle different types of services. For example, an ISDN interface card 44, a digital loop carrier line card 46, and other circuits cards, for supporting similar and other communication services, may be provided.

Figure 2:
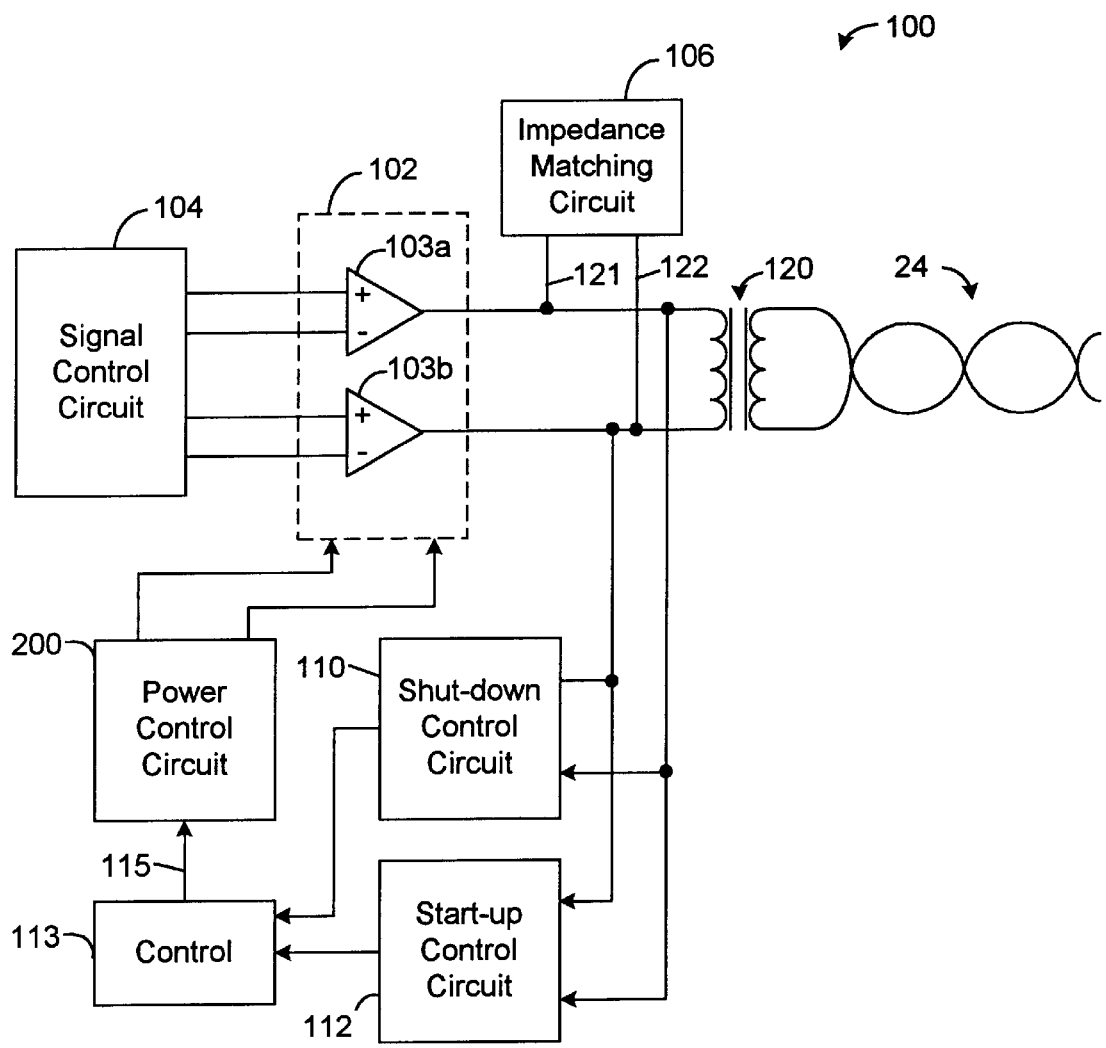
FIG. 2 is a block diagram of a line driver portion of a line card, located at a central office, constructed in accordance with the present invention.

Having illustrated an exemplary environment for the present invention, reference is now made to FIG. 2, which is a block diagram 100 illustrating certain components within a central office line card, constructed in accordance with the present invention. As is well known, a line card includes a line driver circuit 102, which typically includes a pair of differential amplifiers 103a and 103b that are disposed to drive a differential signal over the local loop 24. Typically, the line driver 102 is coupled to the local loop 24 by way of a transformer 120. Block 104 is generically designated as a "Signal Control Circuit." It should be appreciated that this circuit, and/or logic, generates the electrical signals that will drive the line driver 102 in accordance with whatever signal or information is desired to be transmitted over the local loop 24. The signal control circuitry and/or logic 104 may be implemented in a manner that is known in the art, and therefore need not be described in further detail herein. Suffice it to say that the signal control circuit 104 will typically comprise not only discrete circuit components, but also logic sections, such as a CPU executing programmed instructions, to effectuate the signal controls desired.

As is known, the line driver circuit 102 is powered by a balanced positive and negative supply voltage, designated in the drawing as +V and −V. Typically, the positive voltage is +15 volts and the negative supply is −15 volts. However, systems are known that provide alternative supply of voltages, such as +8 volts and −8 volts, or some other (typically balanced) supply of voltage. At times when the line driver circuit 102 is not transmitting information across the local loop 24 it dissipates power in accordance with a relative constant draw of quiescent current. This quiescent current, or power dissipation, varies from line driver to line driver, but values of 30 mAmps are common. It will be appreciated that for many customer premises, and therefore many local loops 24, the vast majority of the time the line drive 102 is not transmitting, as the customer premises is not utilizing its xDSL connection to the central office. Furthermore, in a central office having many line cards to support a large number of customer premises, a significant amount of total power is lost and dissipated within the various line driver circuits 102.

Accordingly, the present invention provides a mechanism for controllably applying, and removing, power to a line driver circuit 102 in direct response to the demand for signal transmission over the local loop 24. In this regard, the present invention is largely provided through a power control circuit 200, which generates the power supply signals (+V and −V) that power the Line driver circuit 102. Consistent with the functionality of the power control circuit 200, a shut down control circuit 110 and a start up control circuit 112 are also illustrated. In the preferred embodiment, the start up control circuit 112 is a circuit the monitors signals received over the local loop 24. The start up control circuit 112 identifies a start up poll signal that is transmitted from the customer premises when establishing a XDSL communication link. Upon receiving this start up poll signal, the start up control circuit 112 signals the power control circuit 200 to apply power to the line driver 102. In similar fashion, a shutdown control circuit 110 may be provided to inform the power control circuit 200 as to when to remove power (+V and −V) to the line driver circuit 102.

In one embodiment, the shutdown control circuit 110 may operate may by sensing a period of time in which no DSL activity has taken place over the loop 24. Upon an extended time out period, the shutdown control circuit 110 may signal the power control circuit 200 to disconnect power (+V and −V) to the line driver circuit 102. Alternatively, it will be appreciated that more sophisticated methods of implementing the start up control circuit 112 and the shutdown control circuit 110 may be implemented, consistent with the concepts and teachings of the present invention. For example, part of the signal control circuit 104 may signal the shut down control circuit 110 when, for example, some sort of disconnect or log out sequence has been undertaken (with regard to the DSL connection) between the customer premises and the central office. Thus, the signal control circuitry 104 may provide more intelligent signaling options for signaling the power control circuit 200 to either apply or remove power from the line driver circuit 102.

Finally, an impedance matching circuit 106 may be provided across the differential lines that drive the transformer 120 and local loop 24. Specifically, the line driver circuit, when operational, is typically designed to have a certain impedance level to match the impedance that is coupled from the local loop 24. When, however, the power is removed form the line driver circuit 102, its output impedance then changes. Accordingly, the impedance matching circuit 106 may be provided to provide line impedance when the line driver circuit 102 is powered down.

The shut down control circuit 110 and the power up control circuit 112 collectively determine the state of the control signal 115. In the embodiment illustrated in FIG. 2 the shutdown control circuit 110 and the power up control circuit 112 may direct their outputs to an additional control circuit 113, which generates the single control circuit 115 that is applied to the power control circuit 200. It will be appreciated that there are a variety of ways to implement the shutdown control circuit 110, startup control circuit 112, and control circuit 113 (collectively), consistent with the concepts and teachings of the present invention. In this regard, and with respect to the inventive aspect of the power control circuit 200, what is relevant for purpose of the present invention is that a control signal 115 is provided to the control circuit 200, which, in response to the control signal 115, generates power supply signals +V and −V that are applied to the line driver circuit 102.

Figure 3:
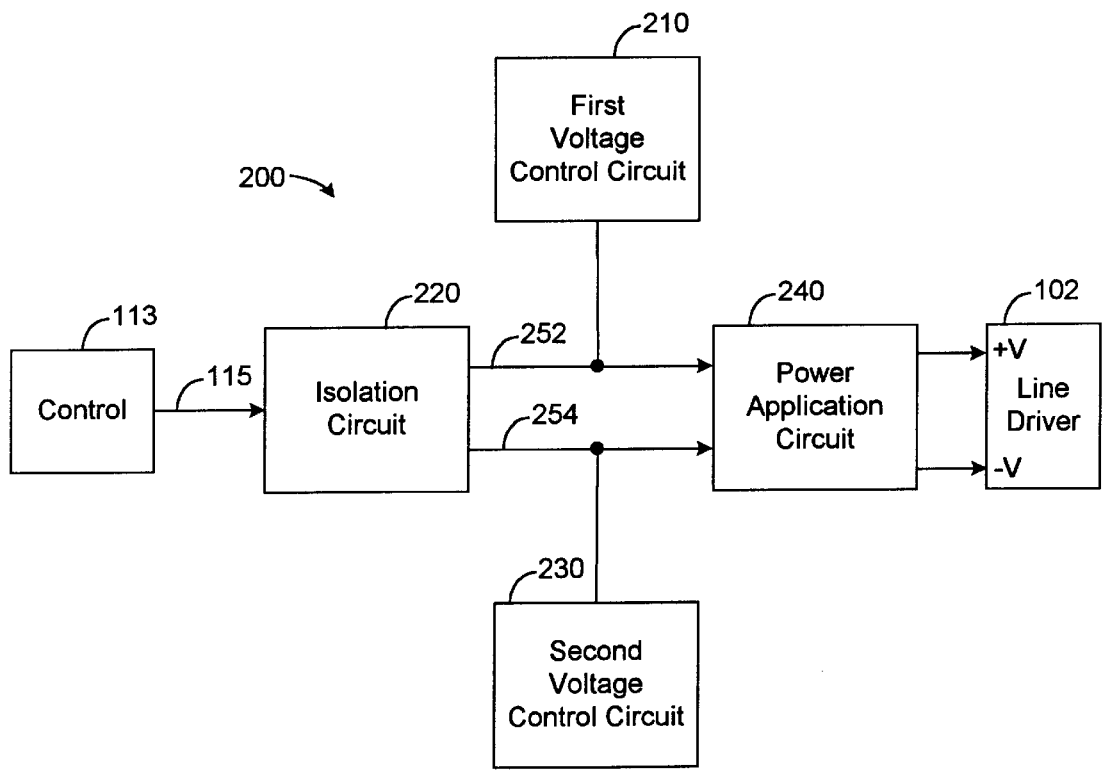
FIG. 3 is a block diagram of the principal components of the present invention.

In accordance with one aspect of the present invention, a power control circuit 200 is provided. To more particularly illustrate the principal components of the power control circuit 200, reference is now made to FIG. 3. As shown, FIG. 3 is block diagram illustrating principal components of the power control circuit 200. As previously mentioned, the power control circuit 200 operates to generate power signals +V and −V in response to a control signal 115.

In accordance with a preferred embodiment, the power control circuit 200 a first voltage control circuit 210, and isolation circuit 220, a second voltage control circuit 230 and a power application circuit 240. As the name implies, the isolation circuit 220 electrically isolates the control signal 115 from interim electrical signals 252 and 254, which are applied to the power application circuit 240. In a matter that will be described in more detail below, the first voltage circuit 210 operates to control the voltage on interim signal line 252. Likewise, the second voltage control circuit 230 operates to control the voltage level on interim signal line 254. Finally, the power application circuit 240 is designed to be responsive to the voltage levels on signal lines 252 and 254 to generate and apply supply voltages +V and −V to the line driver circuit 102. Details on the preferred embodiment of the power control circuit 200 will be described in connection with FIG. 5.

Figure 4:
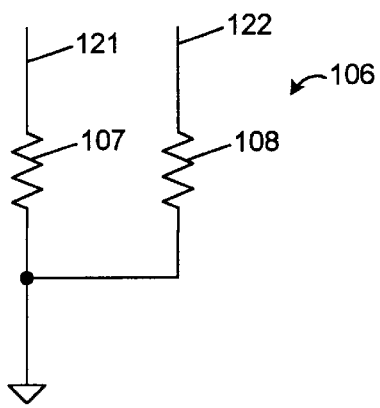
FIG. 4 is a schematic diagram illustrating an impedance matching circuit that may be provided at the output of a line driver.

First, reference is made briefly to FIG. 4, which is a schematic diagram illustrating the impedance matching circuit 106, shown in FIG. 2. As shown, in the preferred embodiment, the impedance matching circuit 106 includes two signal lines 121 and 122 that are interconnected to the differential lines output from the line driver circuit 102. Each of these signal lines 121 and 122 are grounded through resistors 107 and 108. In the preferred embodiment, the resistors 107 and 108 are of substantially equal value. More specifically, resistors 107 and 108 are approximately 5ive kohms, in the preferred implementation.

Figure 5:
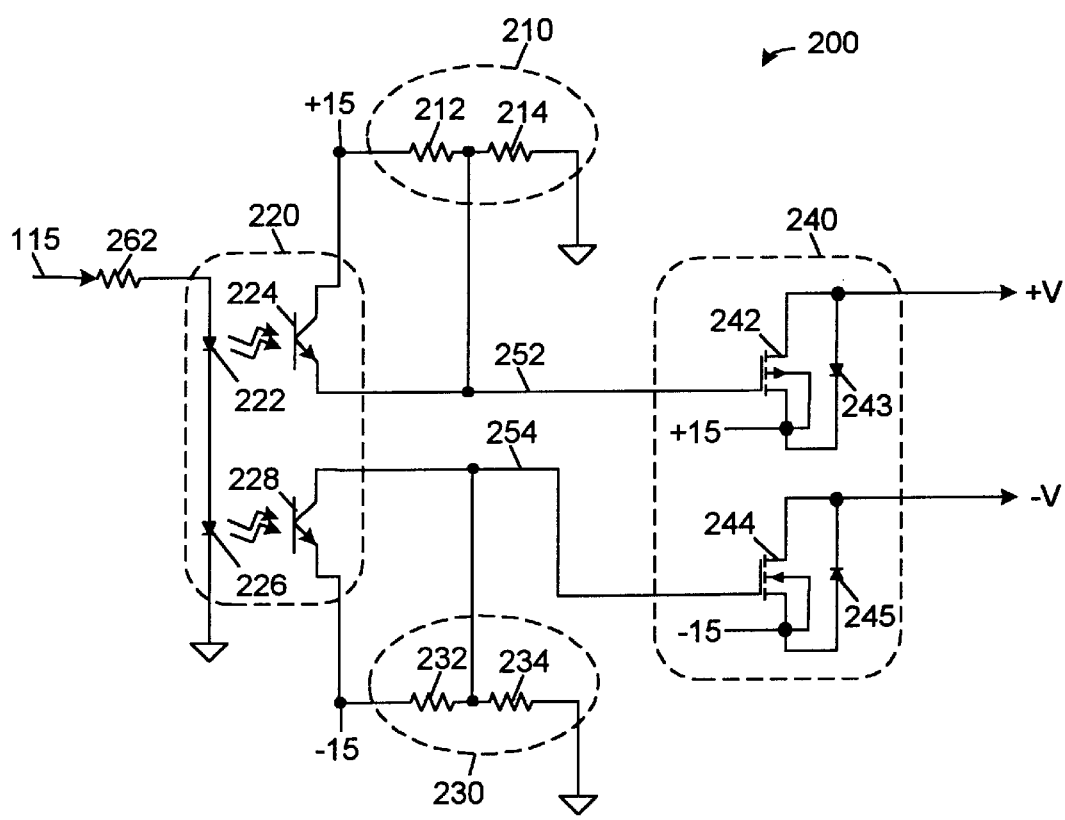
FIG. 5 is a schematic diagram of one embodiment of the present invention.

Reference is now made to FIG. 5, which illustrates the circuit of the power control circuit, as implemented in the preferred embodiment of the present invention. By way of orientation, each of the circuit blocks including the first voltage control circuit 210, the isolation circuit 220, the second voltage control circuit 230, and the power application circuit 240 are illustrated in dashed line FIG. 5. In this regard, the isolation circuit 220 is illustrated as comprising a pair of optocouplers. Specifically, a first optocoupler comprises a first LED 222 and companion photo transistor 224. Likewise, a second optocoupler includes a second LED 226 and companion photo transistor 228. In the preferred implementation of the circuit of FIG. 5, the isolation circuit 220 is implemented using a high isolation voltage SOP (small outline package) multi-optocoupler. Specifically, part no. PS2701-2, manufactured by NEC is a dual optocoupler, that is used to implement this feature. The NEC PS2701-2, and data sheets describing its operation, are publicly available, and therefore need not be described herein.

The power application circuit 240 is implementing using a pair of MOSFETs. Specifically, a P-Channel MOSFET 242 and N-Channel MOSFET 244 are utilized to implement the function of the power application circuit 240. As illustrated, interim signal line 252 is connected to the gate node of the P-Channel MOSFET 242. The source node of the MOSFET 242 is directly connected to a +15 volt power supply, whereas the drain node of MOSFET 242 supplies the +V voltage that is applied to the line driver circuit 102. Diode 243 represents the body-source junction of the MOSFET 242. Similarly, the interim signal line 254 may be connected to the gate node of the N-Channel 244. A −15 volt power supply may be connected to the source node of the MOSFET 244, while the drain node of MOSFET 244 directly supplies the −V voltage that is applied to the line driver circuit 102. Diode 245 represents the body-source junction of the MOSFET 244.

In the preferred implementation, a commercially available part, part no. Si9958DY, manufactured by Temic Semiconductors is utilized to implement the power application circuit 240. The component, as well as data sheets specifically describing the component in detail are publicly available, and therefore need not be described further herein. Indeed, published data sheets of each of the components described herein (i.e., the PS2701-2 and Si9958DY) are hereby incorporated by reference.

Finally, the first voltage control circuit 210 and the second voltage control circuit 230 are preferably implemented using resistors. More specifically, the first voltage control circuit 210 utilizes a pair of resisters 212 and 214 that are series connected between +15 volts and ground. Likewise, the second voltage control circuit is implemented with a pair of resistors 232 and 234 that are series connected between −15 volts and ground. As shown, the first photo transistor 224 of the isolation circuitry 220 is connected between +15 volts and interim signal line 252. The intermediate node between resistors 212 and 214 is also directly connected to this interim signal line 252. Likewise, the photo transistor 228 is electrically connected between the interim signal line 254 and −15 volts. Further, the interim node between resistors 232 and 234 is directly connected to the interim signal line 254. Finally, the two LEDs of the isolation circuitry 220 are series connected between the input control signal 115 and ground. Therefore, when the input control signal 115 is a logic high state (turned on) both the light emitting diode 222 and 226 will emit, and turn on their respected detectors 224 and 228. By appropriately choosing resistor values for the voltage control circuits (resistors 212, 214, 232, and 234), the operation of his circuitry may be controlled so that the interim signal lines 252 and 254 can controllably turn on and off MOSFETs 242 and 244. Specifically, using a +15 and −15 supplies, the ratio between resistor 212 and 214 is two to one. Likewise, the ratio between resistors 232 and 324 is two to one. In the preferred embodiment, resistors 212 and 232 are both selected to be approximately 100 kohms, while resistors 214 and 234 are selected to be approximately 50 kohms.

Using these values, when photo transistors 224 and 228 are turned off, the voltage at the interim node between resistors 212 and 214 is approximately 5 volts. That is, due to the series connection between the +15 volts and ground through resistors 212 and 214. Approximately ten volts are dropped across resistor 212, while five volts are dropped across resistor 214. Therefore, the voltage on the interim node is approximately five volts. In similar fashion, the voltage at the interim node between resistors 232 and 234 is approximately −5 volts. With the values of +5 volts applied to the gate node of MOSFET 242 and −5 volts applied to the gate node of MOSFET 244, both of these MOSFETs 242 and 244 turn on to supply +15 volts and −15 volts respectively, to the +V and −V supply inputs to the line driver circuit 102. When the control signal 115 turns on, it causes LEDs 222 and 226 to emit and therefore turn on photo transistors 224 and 228. When these turn on, the +15 volts and −15 volts, respectively, are applied to interim signal lines 252 and 254. When +15 volts and −15 volts are so applied to the gate nodes of MOSFETs 242 and 244, respectively, the MOSFETs turn off, consequently removing the power previously supplied to the +V and −V inputs to the line driver circuit 102.

Finally, and as illustrated in FIG. 5, an input resistor 262 is also provided and series connected with the input control signal 115. In the preferred embodiment, this is a 174 ohm resistor that is provided merely to limit the current that is applied to the LEDs 222 and 226.

Figure 6:
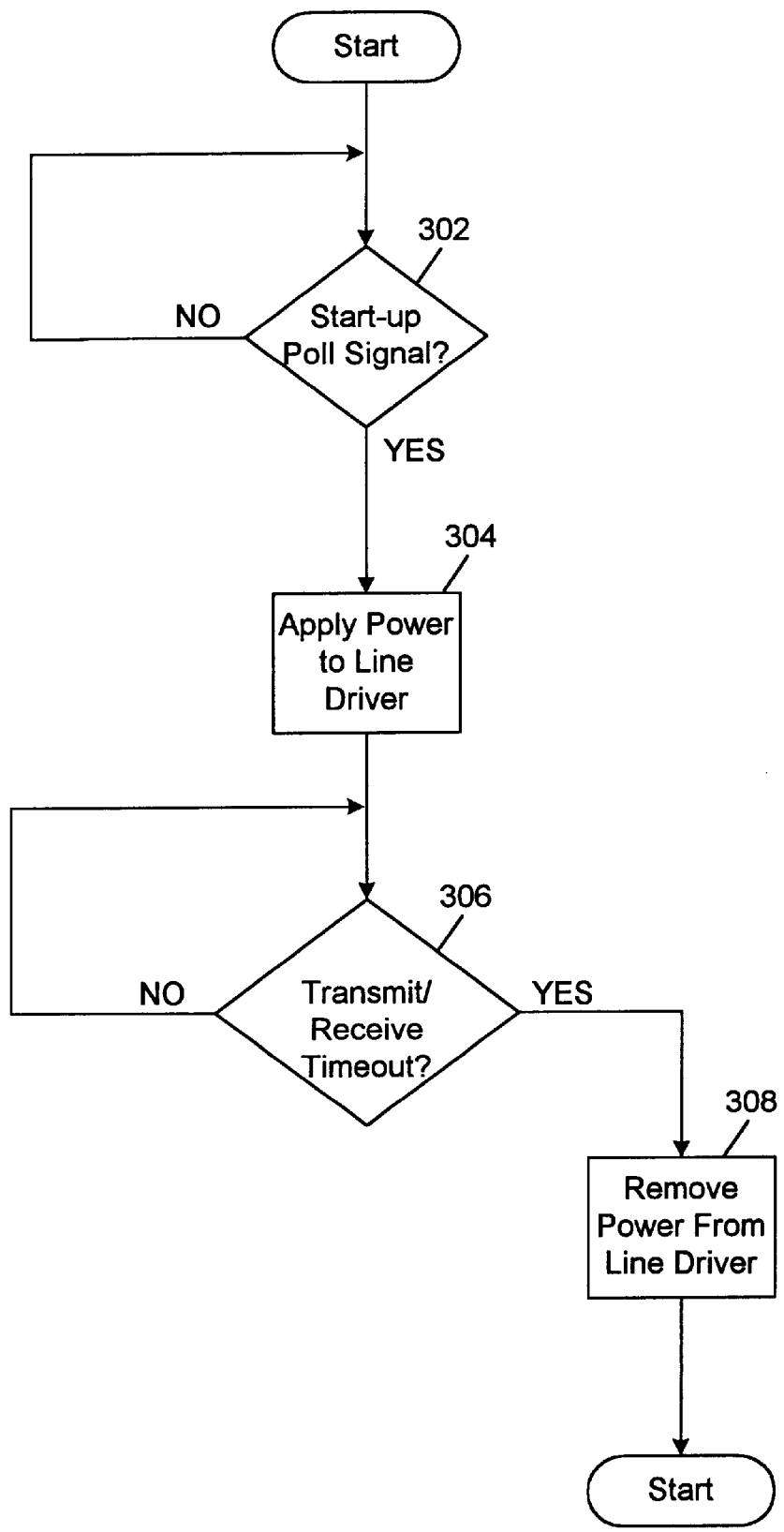
FIG. 6 is a flowchart illustrating functional steps within the operation of a system constructed in accordance with the present invention.

Reference is now made briefly to FIG. 6, which is a flow chart that illustrates the top-level functional operation of a system constructed in accordance with the present invention. In accordance with this top-level operation, the system (at step 302) operates to monitor transmissions received from the customer premises to detect a start-up poll signal. Once this signal is detected, the system then applies power to the line driver circuit (step 304). The system then (at step 306) continually monitors the transmissions to and from the central office and the customer premises. Specifically, a timer may be reset each time a transmission takes place. If no transmissions occur for a period of time (i.e., a time-out period), then the system may remove the power applied to the line driver circuit (step 308). In this way, the power dissipation that results from applying power to the line driver circuits, which are not in use, is minimized.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A power application control circuit for a line driver comprising:

a first optocoupler comprising a first light emitting diode and a first phototransistor disposed to sense emissions from the first light emitting diode, wherein the first light emitting diode is configured to receive an input power control signal;

a second optocoupler comprising a second light emitting diode and a second phototransistor disposed to sense emissions from the second light emitting diode, wherein the second light emitting diode is series-connected with the first light emitting diode between the input power control signal and ground;

a p-channel MOSFET having a source node coupled to a positive power supply, the p-channel MOSFET having a gate node coupled to an output of the first phototransistor, and the p-channel MOSFET having a drain output coupled to a positive power input of the line driver;

a n-channel MOSFET having a source node coupled to a negative power supply, the n-channel MOSFET having a gate node coupled to an input of the second phototransistor, and the n-channel MOSFET having a drain output coupled to a negative power input of the line driver;

a first voltage control circuit coupled to the gate node of the p-channel MOSFET, the first voltage control circuit configured to turn the p-channel MOSFET off when the first optocoupler is turned on, the first voltage control circuit configured to turn the p-channel MOSFET on when the first optocoupler is turned off; and a second voltage control circuit coupled to the gate node of the n-channel MOSFET, the second voltage control circuit configured to turn the n-channel MOSFET off when the second optocoupler is turned on, the second voltage control circuit configured to turn the n-channel MOSFET on when the second optocoupler is turned off.

2. The power application control circuit as defined in claim 1, wherein the first voltage control circuit comprises a first resistor network.

3. The power application control circuit as defined in claim 2, wherein the first resistor network is interposed between the positive power supply and the gate node of the p-channel MOSFET.

4. The power application control circuit as defined in claim 3, wherein the first resistor network comprises a first resistor and a second resistor, the first resistor being interposed between the positive power supply and the gate node of the p-channel MOSFET and the second resistor being interposed between the gate node of the p-channel MOSFET and ground.

5. The power application control circuit as defined in claim 4, wherein the first resistor is approximately twice the value of the second resistor.

6. The power application control circuit as defined in claim 1, wherein the second voltage control circuit comprises a second resistor network.

7. The power application control circuit as defined in claim 6, wherein the second resistor network is interposed between the negative power supply and the gate node of the n-channel MOSFET.

8. The power application control circuit as defined in claim 7, wherein the second resistor network comprises a first resistor and a second resistor, the first resistor being interposed between the negative power supply and the gate node of the n-channel MOSFET and the second resistor being interposed between the gate node of the n-channel MOSFET and ground.

9. The power application control circuit as defined in claim 8, wherein the first resistor is approximately twice the value of the second resistor.

10. A power application control circuit for a line driver comprising:
   an isolation circuit disposed to receive a power control signal, the isolation circuit configured to generate a pair of output signals that are electrically isolated from the power control signal, each of the output signals having a state that is determined by the power control signal; and
   a power application circuit having a first and second input and a first and second output, wherein the first input is coupled to a first output of the isolation circuit and the second input is coupled to a second output of the isolation circuit, and wherein the first output is disposed to be coupled to a positive power input of the line driver and the second is disposed to be coupled to a negative power input of the line driver.

11. The power application control circuit as defined in claim 10, wherein the isolation circuit comprises a pair of optocouplers.

12. The power application control circuit as defined in claim 11, wherein the pair of optocouplers includes a first optocoupler comprising a first light emitting diode and a first phototransistor disposed to sense emissions from the first light emitting diode, wherein the first light emitting diode is configured to receive an input power control signal, the pair of optocouplers further includes a second optocoupler comprising a second light emitting diode and a second phototransistor disposed to sense emissions from the second light emitting diode, wherein the second light emitting diode is series-connected with the first light emitting diode between the input power control signal and ground.

13. The power application control circuit as defined in claim 10, wherein the power application circuit includes a p-channel MOSFET having a source node coupled to a positive power supply, the p-channel MOSFET having a gate node coupled to an output of the first phototransistor, and the p-channel MOSFET having a drain output coupled to a positive power input of the line driver, the power application circuit further includes a n-channel MOSFET having a source node coupled to a negative power supply, the n-channel MOSFET having a gate node coupled to an input of the second phototransistor, and the n-channel MOSFET having a drain output coupled to a negative power input of the line driver.

14. The power application control circuit as defined in claim 10, further comprising a first voltage control circuit coupled to the first input of the power application circuit, and a second voltage control circuit coupled to the second input of the power application circuit.

15. The power application control circuit as defined in claim 14, wherein the first voltage control circuit comprises a first resistor network and the second voltage control circuit comprises a second resistor network.

16. The power application control circuit as defined in claim 15, wherein the first resistor network comprises a first resistor interposed between the positive power input and the first input of the power application circuit and a second resistor interposed between the first input of the power application circuit and ground.

17. The power application control circuit as defined in claim 15, wherein the second resistor network comprises a first resistor interposed between the negative power input and the second input of the power application circuit and a second resistor interposed between the second input of the power application circuit and ground.

18. A system for controllably applying power to a line driver comprising:
   a line driver circuit at a central office having a first and second output signal configured to transmit a differential transmission signal to a customer premises over a local loop;
   an impedance matching circuit disposed at an output of the line driver circuit and configured to maintain a low impedance of conductors within the local loop;
   a start-up control circuit coupled to the local loop and configured to sense signal activity over the local loop; and
   a power application control circuit coupled to the line driver circuit and configured to control the application of power signals to the line driver circuit, in response to the start-up control circuit.

19. The system as defined in claim 18, wherein the local loop comprises a two-wire pair.

20. The system as defined in claim 18, wherein the impedance matching circuit includes a first resistor interposed between the first output signal of the line driver and ground, the impedance matching circuit further includes a second resistor interposed between the second output signal of the line driver and ground.

21. The system as defined in claim 20, wherein the first and second resistors of the impedance matching circuit are approximately the same value.

22. The system as defined in claim 20, wherein the power application circuit includes:
   a first optocoupler comprising a first light emitting diode and a first phototransistor disposed to sense emissions from the first light emitting diode, wherein the first light emitting diode is configured to receive an input power control signal;

a second optocoupler comprising a second light emitting diode and a second phototransistor disposed to sense emissions from the second light emitting diode, wherein the second light emitting diode is series-connected with the first light emitting diode between the input power control signal and ground;

a p-channel MOSFET having a source node coupled to a positive power supply, the p-channel MOSFET having a gate node coupled to an output of the first phototransistor, and the p-channel MOSFET having a drain output coupled to a positive power input of the line driver;

a n-channel MOSFET having a source node coupled to a negative power supply, the n-channel MOSFET having a gate node coupled to an input of the second phototransistor, and the n-channel MOSFET having a drain output coupled to a negative power input of the line driver, a first voltage control circuit coupled to the gate node of the p-channel MOSFET, the first voltage control circuit configured to turn the p-channel MOSFET off when the first optocoupler is turned on, the first voltage control circuit configured to turn the p-channel MOSFET on when the first optocoupler is turned off; and a second voltage control circuit coupled to the gate node of the n-channel MOSFET, the second voltage control circuit configured to turn the n-channel MOSFET off when the second optocoupler is turned on, the second voltage control circuit configured to turn the n-channel MOSFET on when the second optocoupler is turned off.

23. The system as defined in claim 18, further including a shut-down control circuit configured to sense signal inactivity over the local loop, wherein the power application control circuit is further configured to control the application of power to the line driver in further response to the shut-down control circuit.

* * * * *

UNITED STATES PATENT AND TRADEMARK OFFICE
CERTIFICATE OF CORRECTION

PATENT NO. : 6,211,719 B1
DATED : April 3, 2001
INVENTOR(S) : Thomas H. deBrigard Page 1 of 1

It is certified that error appears in the above-identified patent and that said Letters Patent is hereby corrected as shown below:

Column 5,
Lines 43 and 46, please delete "power" and substitute therefor -- start --

Column 6,
Line 27, please delete "5ive" and substitute therefor -- five --
Lines 58 and 60, please delete "maybe" and substitute therefor -- is --

Column 7,
Line 10, please delete "resisters" and substitute therefor -- resistors --
Line 35, "100" should not be bold
Line 40, "5" should not be bold Column 8,
Line 51, please delete "input" and substitute therefor -- output --

Column 10,
Line 9, please delete "input" and substitute therefor -- output --

Column 11,
Line 15, please delete "input" and substitute therefor -- output --

Signed and Sealed this

Sixteenth Day of April, 2002

Attest:

JAMES E. ROGAN
*Director of the United States Patent and Trademark Office*

*Attesting Officer*